US012230315B2

(12) United States Patent
Rayaprolu et al.

(10) Patent No.: US 12,230,315 B2
(45) Date of Patent: Feb. 18, 2025

(54) MODEL FOR PREDICTING MEMORY SYSTEM PERFORMANCE

(71) Applicant: Micron Technology, Inc., Boise, ID (US)

(72) Inventors: Vamsi Pavan Rayaprolu, Santa Clara, CA (US); Aswin Thiruvengadam, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 17/819,567

(22) Filed: Aug. 12, 2022

(65) Prior Publication Data

US 2024/0055046 A1 Feb. 15, 2024

(51) Int. Cl.
*G11C 11/4076* (2006.01)
*G11C 7/24* (2006.01)
*G11C 11/4096* (2006.01)

(52) U.S. Cl.
CPC ............ *G11C 11/4096* (2013.01); *G11C 7/24* (2013.01); *G11C 11/4076* (2013.01)

(58) Field of Classification Search
CPC .... G11C 11/4076; G11C 11/4096; G11C 7/24
USPC .................................................. 365/189.011
See application file for complete search history.

(56) References Cited

U.S. PATENT DOCUMENTS

| | | | | |
|---|---|---|---|---|
| 10,998,041 | B1* | 5/2021 | Avraham | G11C 29/028 |
| 11,133,083 | B1* | 9/2021 | Fitzpatrick | G11C 7/04 |
| 2015/0370629 | A1* | 12/2015 | Song | G06F 11/1048 |
| | | | | 714/721 |
| 2017/0162268 | A1* | 6/2017 | Chen | G11C 16/26 |
| 2022/0130472 | A1* | 4/2022 | Zhang | G11C 11/5642 |
| 2022/0199185 | A1* | 6/2022 | Yoon | G11C 29/18 |
| 2022/0319610 | A1* | 10/2022 | Hwang | G11C 16/102 |
| 2022/0398031 | A1* | 12/2022 | Asadi | G11C 29/52 |

* cited by examiner

*Primary Examiner* — Ly D Pham
(74) *Attorney, Agent, or Firm* — Holland & Hart LLP

(57) ABSTRACT

Methods, systems, and devices for a model for predicting memory system performance are described. A memory system may generate a set of read commands and perform a first set of read operations at a memory device according to the generated read commands. The memory system may generate information indicating a performance of the memory device based on the first set of read operations and may update one or more coefficients of a model that correlates the information with a change in a read window. In some cases, the memory system may model the change in a read window based on the information and update one or more parameters associated with read operations based on the modelled change in the read window. The memory system may perform a second set of read operations at the memory device using the one or more updated parameters.

23 Claims, 6 Drawing Sheets

| Mechanisms 405 | X-Axis Type 410 | X-Axis Information 415 | Y-Axis Type 425 | Y-Axis Information 430 | Target Access Line 440 | Target Valley 450 | Degree 460 | Read Info 465 |
|---|---|---|---|---|---|---|---|---|
| Mechanism 405-a | X-Axis Type 410-a | Information 420-a | Y-Axis Type 425-a | Information 435-a | Access Line 445-a | Valley 455-a | Degree 460-a | Read Info 465-a |
| Mechanism 405-b | X-Axis Type 410-b | Information 420-b | Y-Axis Type 425-b | Information 435-b | Access Line 445-b | Valley 455-b | Degree 460-b | Read Info 465-b |
| Mechanism 405-c | X-Axis Type 410-c | Information 420-c | Y-Axis Type 425-c | Information 435-c | Access Line 445-c | Valley 455-c | Degree 460-c | Read Info 465-c |
| ⋮ | | | | | | | | |
| Mechanism 405-d | X-Axis Type 410-d | Information 420-d | Y-Axis Type 425-d | Information 435-d | Access Line 445-d | Valley 455-d | Degree 460-d | Read Info 465-d |

FIG. 4A ⤹ 400

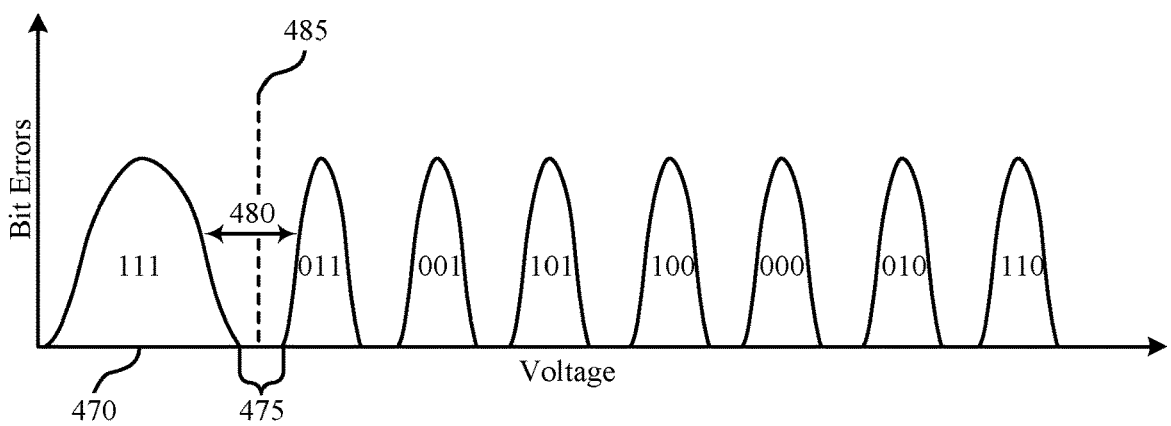

FIG. 4B ⤹ 401

MODEL FOR PREDICTING MEMORY SYSTEM PERFORMANCE

FIELD OF TECHNOLOGY

The following relates to one or more systems for memory, including a model for predicting memory system performance.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIG. 4A illustrates an example of mechanism information that supports a model for predicting memory system performance in accordance with examples as disclosed herein.

FIG. 4B illustrates an example of a threshold voltage distribution that supports a model for predicting memory system performance in accordance with examples as disclosed herein.

DETAILED DESCRIPTION

Figure 1:
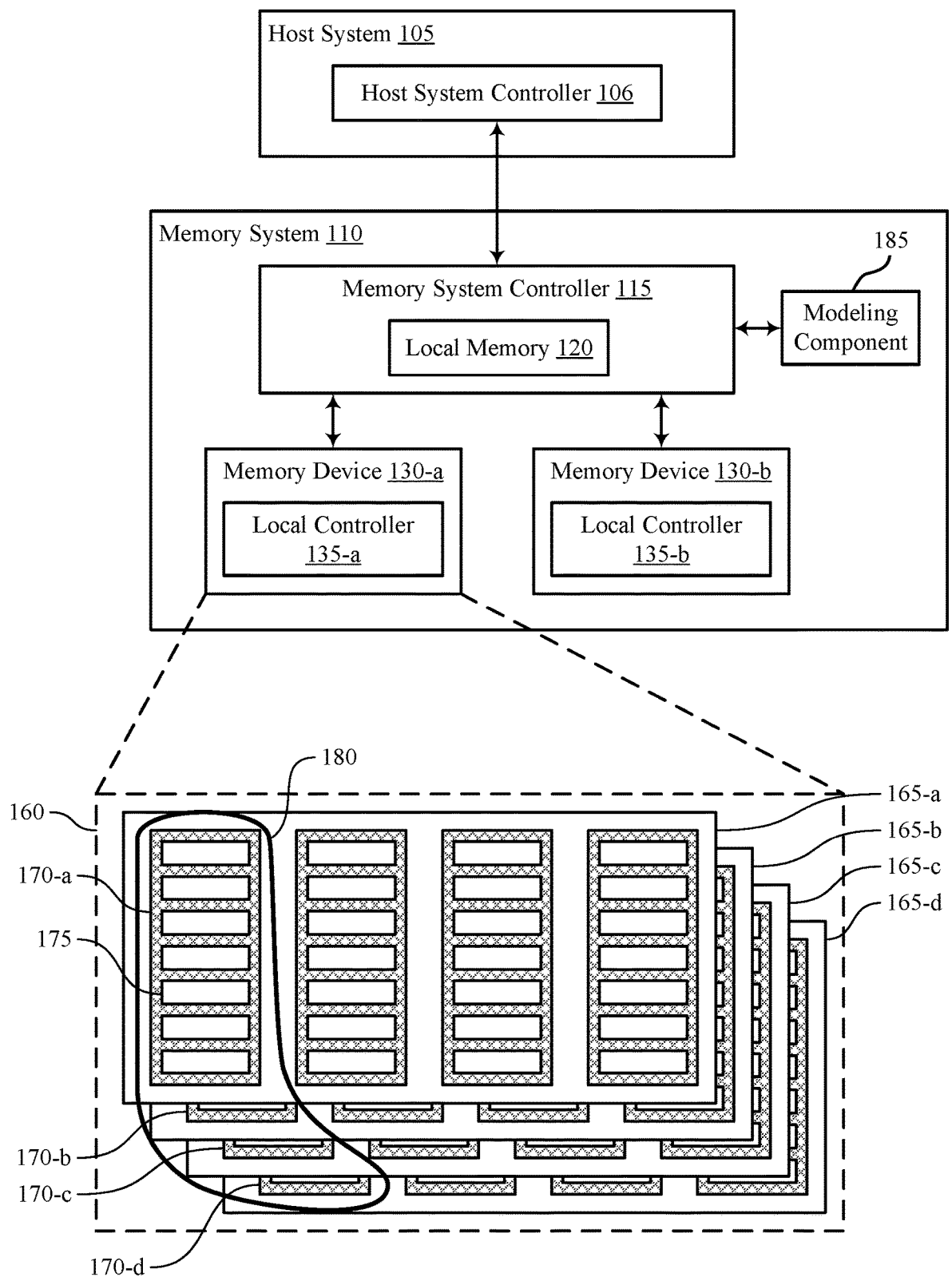
FIG. 1 illustrates an example of a system that supports a model for predicting memory system performance in accordance with examples as disclosed herein.

Some memory systems may include memory cells that store one or more bits of data. To read data from a memory cell, the memory system may apply a read voltage to the memory cell and measure a resulting amount of current that flows through the memory cell. For example, the memory cell may have a threshold voltage associated with a value of the one or more bits of data stored by the memory cell, and in cases that the memory system applies a read voltage that is greater than the threshold voltage of the memory cell, current may flow through the memory cell. Additionally, in cases that the memory system applies a read voltage that is less than the threshold voltage of the memory cell, current may have a more restricted flow through the memory cell. For example, a memory system may determine a logic state stored by a memory cell capable of storing a single bit of data (e.g., a single level cell (SLC)) based on the presence or absence of current when a read voltage is applied. In another example of a memory system reading a memory cell capable of storing more than one bit of data (e.g., a multi-level cell (MLC), tri-level cell (TLC), or quad-level cell (QLC)), the memory system may determine the various logic values (e.g., 00, 01, 10, 11) stored by the memory cell based on the presence or absence of current when multiple different read voltages are applied. To read data stored by a memory cell, the memory system may select a read voltage that is within a read window, which corresponds to a range of read levels between two consecutive voltage threshold distributions where data may be read from the memory cell reliably. That is, the read window may correspond to a range of read levels between two voltage threshold distributions where the bit errors may be correctable by an error correction code engine. In some cases, the read window may additionally be associated with a voltage range between one or more threshold voltage distributions that represent different logical states of the memory cell.

Over time, the read window of the memory cells may change. For example, the voltage range associated with read windows may shift or decrease in size as a result of characteristics of the memory cells changing over time. In some cases, a system (e.g., a memory system, a host system) may estimate changes of the read windows over time based on various mechanisms (e.g., data retention characteristics of the memory cells, a quantity of read disturb cycles at the memory cells, a quantity of program and erase cycles performed on a memory cell, a quantity of read and write operations performed on a memory cell, a measured read window of a memory cell) that may be associated with or indicative of various read window changes. For example, the system may model the change (e.g., degradation) of the read window associated with one or more mechanisms independently. These models may enable the system to estimate a read window of memory cells at the memory system over time. However, a system that relies on independent models that are each associated with different mechanisms may execute a large quantity of complex calculations to model the read window over time, which may lead to increased latency and power consumption at the memory system. Additionally, or alternatively, a system that relies on independent models each associated with different mechanisms may not accurately identify how a combination of the mechanisms affect the read window over time, which may decrease the reliability of the memory system.

The techniques described herein may enable a system (e.g., a memory system, a host system) to utilize a single model to correlate information associated with more than one mechanism to the read window (e.g., to predict the read window over time based on the information associated with the more than one mechanism). Additionally, or alternatively, the system may dynamically update coefficients correlating the information associated with the multiple mechanisms to the read window. That is, over time, a correlation between various mechanisms and the read window may change. By updating the coefficients correlating the information associated with a mechanism to the read window, the system may adapt the model as the correlations between the mechanism and the read window changes. To update the coefficients, the system may perform a set of read operations at a memory device and generate information that indicates a performance of the memory device. For example, the system may generate read commands indicating a set of read operations with characteristics to generate information associated with a mechanism. Based on the generated information associated with the mechanism, the system may update one or more of the coefficients that correlates the information with a read window. In some cases, relying on a single model that dynamically correlates information associated with multiple mechanisms with a predicted read window, a memory system may reduce computational complexities associated with predicting the read window, reduce power consumption of the memory system, and improve the reliability of data stored at the memory system.

Figure 2:
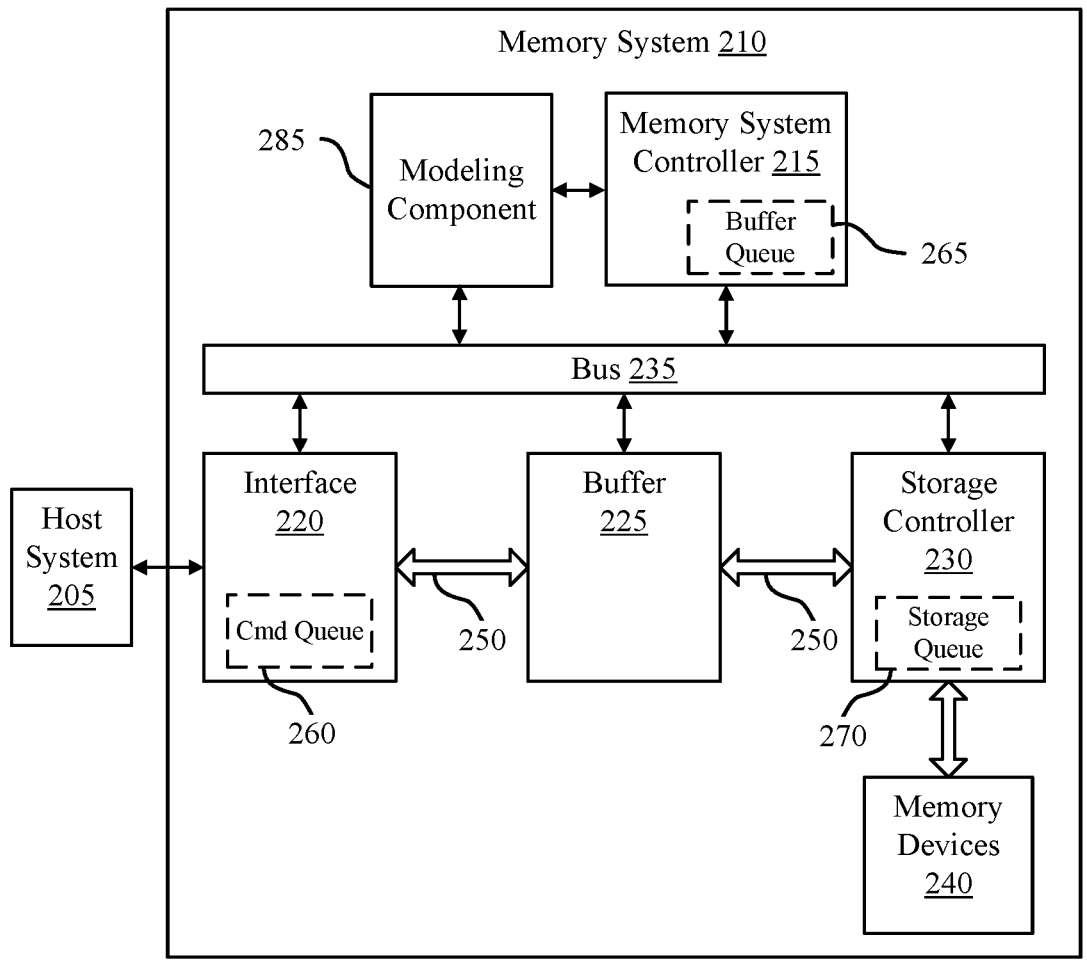
FIG. 2 illustrates an example of a system that supports a model for predicting memory system performance in accordance with examples as disclosed herein.

Features of the disclosure are initially described in the context of systems, devices, and circuits with reference to FIGS. 1 and 2. Features of the disclosure are described in the context of a process flow, mechanism information, and a threshold voltage distribution with reference to FIGS. 3 through 4B. These and other features of the disclosure are further illustrated by and described in the context of a block diagram of a memory system and a flowchart that relate to a model for predicting memory system performance with reference to FIGS. 5 through 6.

FIG. 1 illustrates an example of a system 100 that supports a model for predicting memory system performance in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMN interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally, or alternatively, a NAND memory device 130 may include memory cells configured to each store multiple bits of information, which may be referred to MLCs if configured to each store two bits of information, as TLCs if configured to each store three bits of information, as QLCs if configured to each store four bits of information, or more generically as multiple-level memory cells. Multiple-level memory cells may provide greater density of storage relative to SLC memory cells but may, in some cases, involve narrower read or write margins or greater complexities for supporting circuitry. For example, the read margins may correspond to a read window, which corresponds to a voltage range between one or more threshold voltage distributions that represent different logical states of the memory cell.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

The system 100 may include any quantity of non-transitory computer readable media that support a model for predicting memory system performance. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the read window of the memory cells within the memory device 150-a and the memory device 150-b may change over time. For example, the voltage range associated with read windows may shift or decrease in size as a result of characteristics of the memory cells changing over time, thus limiting the range of read voltages that may be applied to a memory cell to retrieve the stored data. In some cases, a system (e.g., the memory system 110, the host system 105) may estimate changes of the read windows over time based on various mechanisms (e.g., data retention, read disturb cycles, program/erase cycles, read/write operations) that may be associated with or indicative of read window changes. The effects of various mechanisms on various characteristics of memory devices may be modeled linearly on a linear-linear, log-linear, linear-log, or log-log scale, thus enabling the memory system to model the change of the read window of a memory cell over time.

In some cases, a system (e.g., the memory system 110, the host system 105) may model the change of the read window caused by each mechanism independently. These models may enable the system to estimate a read window of memory cells at the memory system over time. However, a system that relies on independent models each associated with different mechanisms may execute a large quantity of complex calculations to model the read window over time, which may lead to increased latency and power consumption at the memory system. Additionally, or alternatively, a system that relies on independent models each associated with different mechanisms may not accurately identify how each of the mechanisms affect the read window over time. In some cases, not accurately identifying how each of the mechanisms affects the read window over time may decrease the reliability of the memory system 110.

In some implementations of the present disclosure, the system (e.g., the memory system 110, the host system 105) may utilize a single model to correlate information associated with more than one mechanism to the read window (e.g., to predict the read window over time based on the information associated with the more than one mechanism). For example, the memory system 110 may use the modeling component 185 to correlate information associated with one or more mechanisms to the read window. Additionally, or alternatively, the memory system 110 may dynamically update coefficients correlating the information associated with the multiple mechanisms to the read window.

To update the coefficients, the memory system 110 may perform a set of read operations at the memory device 130-a or the memory device 130-b and generate information that indicates a performance of the memory devices 130. For example, the memory system 110 may generate a set of read commands indicating read operations with characteristics to generate information associated with a mechanism. The memory system 110 may update one or more coefficients of the model that correlates the information with a read window based on the generated information. For example, the memory system 110 may use the model to correlate the information associated with the one or more mechanisms with a change in the read window. Over time, the correlation between the information and the read window may change, thus the memory system 110 may update the coefficients of the model (e.g., to improve the correlation between the information and read window). The memory system 110 may use the updated coefficients to perform additional read operations at the memory device 130-a and the memory device 130-b using one or more updated parameters indicated by the model. For example, the memory system 110 may use the updated coefficients from the model to update one or more parameters associated with read operations (e.g., to reduce the affect read operations have on the read window). In this way, the memory system 110 may use a single model to correlate the information associated with more than one mechanism with a read window, thereby reducing implementation complexity, reducing power consumption, and increasing efficiency in the memory system 110.

FIG. 2 illustrates an example of a system 200 that supports a model for predicting memory system performance in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller

215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

Each memory cell of the memory devices 240 may have a corresponding read window. A read window of a memory cell may refer to a voltage range between one or more threshold voltage distributions that represent different logical states of the memory cell. Thus, to read data stored by a memory cell, the memory system 210 may select a read voltage that is within the read window of a particular memory cell.

In some cases, the read window of each memory cell of the memory devices 240 may change over time. Additionally, one or more mechanisms associated with operating the memory device 240 may be indicative of the change of the read window over time. The techniques described herein may enable a memory system 210 to utilize a modeling component 285 to model the change of the read window associated with more than one mechanisms and adjust read operations based on the modeled (e.g., predicted) read windows of the memory cells. For example, the memory system 210 may perform a set of read operations to generate information associated with one or more mechanisms. The memory system 210 may utilize the modeling component 285 to correlate the generated information associated with one or more mechanisms to the read window. Additionally, the memory system 210 may update one or more coefficients of the modeling component 285 (e.g., based on a changing correlation between the information associated with the one or more mechanisms to the read window). The memory system 210 may use the updated coefficients to update one or more parameters associated with read operations.

For example, the memory system 210 may execute read operations based on a predicted read window indicated by the modeling component 285 (e.g., based on a correlation between the information and the read window indicated by the modeling component 285). For example, the memory system 210 may adjust read voltages applied during a read operation, read voltage thresholds, read operation timings, or the like. Thus, the memory system 210 may probe the model and adjust one or more trims of a read operation to reduce the change of the read window associated with each memory cell. Additionally, the memory system may adjust read voltages associated with various memory cells to be within the predicted read window indicated by the model. In some cases, the memory system may adjust the frequency of data integrity or media scans based on the predicted read window. For example, in cases where rate of degradation of the read window is relatively high (e.g., in cases that the read window is shifting or decreasing in size relatively quickly), the memory system may increase the frequency of data integrity or media scans. Additionally, in cases where rate of degradation of the read window is relatively low (e.g., in cases that the read window is shifting or decreasing in size relatively slowly), the memory system may decrease the frequency of data integrity or media scans. Thus, the memory system 210 may increase the reliability of one or more memory cells by adjusting read voltages based on the predicted read window.

Figure 3:
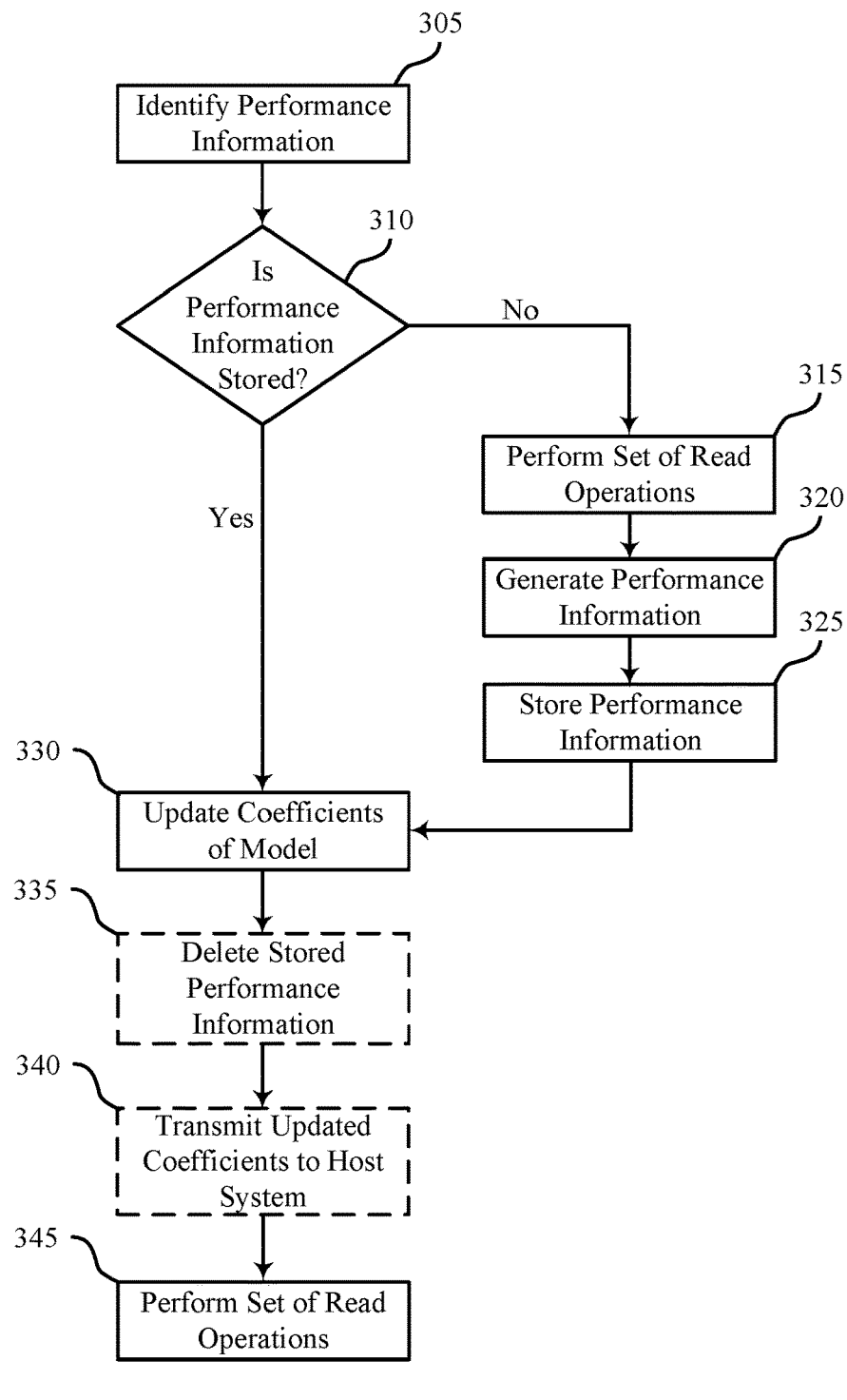
FIG. 3 illustrates an example of a process flow that supports a model for predicting memory system performance in accordance with examples as disclosed herein.

FIG. 3 illustrates an example of a process flow 300 that supports a model for predicting memory system performance in accordance with examples as disclosed herein. The process flow 300 may be implemented by a memory system, which may be an example of a memory system as described with reference to FIGS. 1 and 2. Alternative examples of the following may be implemented, where some processes are performed in a different order than described or are not performed. In some cases, the process flow 300 may include additional features not mentioned below, or further processes may be added.

In some implementations, a memory system may rely on a single model to correlate information associated with more than one mechanism (e.g., data retention characteristics of the memory cells, a quantity of read disturb cycles at the memory cells, a quantity of program and erase cycles performed on a memory cell, a quantity of read and write operations performed on a memory cell, a measured read window) to a read window (e.g., to a predicted read window). Additionally, the memory system may dynamically update coefficients correlating the information associated with the multiple mechanisms to the read window. In some cases, the memory system may execute the process flow 300 to update coefficients correlating information associated with one or more mechanisms to the read window.

At 305, the memory system may identify the information associated with the one or more mechanisms. That is, in cases that the memory system determines to update the coefficients correlating information associated with a first mechanism to the read window, the memory system may identify the information associated with the first mechanism at 305. The performance information associated with a mechanism may correspond to information detected or identified in response to the memory system executing one or more read operations, where the information is associated with the corresponding mechanism.

For example, in cases that the memory system determines to update the coefficients correlating information associated with a data retention mechanism to the read window, at 305 the memory system may identify performance information including a read voltage range (e.g., mDiffEC) and a threshold voltage distribution of one or more memory cells storing a predetermined logic state over time. That is, the read voltage range as a function of the threshold voltage distribution of a memory cell storing the predetermined logic state over time may be indicative of a data retention capability of memory cells at a memory device of the memory system. Additionally, in cases that the memory system determines to update coefficients correlating information associated with a voltage threshold shift mechanism (e.g., a slow charge loss (SCL) shift) to the read window, at 305 the memory system may identify performance information including a threshold voltage distribution of a memory cell storing a predetermined logic state over time. That is, the threshold distribution of the memory cell storing the predetermined logic state as the function of time may be indicative of a voltage threshold shift mechanism such as an SCL of a memory cell over time.

In another case where the memory system determines to update coefficients correlating information associated with a read disturb mechanism to the read window, at 305 the memory system may identify performance information including a quantity of read operations and an average read voltage (e.g., centerEC). In some cases, a read disturb may correspond to a threshold voltage change of a memory cell caused by read voltages applied to the memory cell. Here, the average read voltage associated with a quantity of read operations may be indicative of the read disturb mechanism of a memory cell. Additionally, in cases that the memory system determines to update coefficients correlating information associated with a latent read disturb mechanism to a read window, at 305 the memory system may identify performance information including a read voltage range and a threshold voltage distribution of a memory cell storing a predetermined logic state over time. That is, the read voltage range as a function of the threshold voltage distribution of a memory cell storing the predetermined logic state over time may be indicative of a latent read disturb of a memory cell.

In another case where the memory system determines to update coefficients correlating information associated with a measured read window mechanism to a read window (e.g., a predicted read window), at 305 the memory system may identify performance information including a threshold voltage difference between adjacent threshold voltage distributions of a memory cell. That is, the threshold voltage difference between adjacent threshold voltage distributions of a memory cell may be indicative of a measured read window.

At 310, the memory system may determine whether the performance information identified at 305 is stored at the memory system. For example, the memory system may determine whether any performance information stored at the memory system (e.g., stored at a modeling component of the memory system, at a controller of the memory system, at a buffer or cache of the memory system, at a memory device of the memory system, or a combination thereof) is the same as the performance information identified at 305. That is, the performance information identified at 305 may be associated with characteristics of read operations and the memory system may determine whether any stored performance information is associated with those characteristics. In some cases, the characteristics may include one or more target access lines associated with the read operations, one or more target valleys associated with the read operations, a rate of the read operations, or a combination thereof. As an illustrative example, if at 305 the memory system identifies performance information associated with a data retention capability mechanism, at 310 the memory system may determine whether performance information associated with a read voltage range and based on read operations associated with a predefined target valley and target access line (e.g., associated with the read voltage range) is stored at the memory system.

In some cases, the memory system may have stored the performance information identified at 305 prior to 310. For example, the memory system may have performed one or more read operations (e.g., in response to internally-generated read commands, in response to read command received from a host system) in accordance with the characteristics, which may have enabled the memory system to generate and store the identified performance information prior to 310. Here, at 310 the memory system may determine that the performance is stored at the memory system and proceed to 330.

In another example where, at 310, the memory system determines that the identified performance information is not stored at the memory system, the memory system may proceed to 315. At 315 the memory system may perform a set of read operations at a memory device of the memory system. That is, the memory system may generate a set of read commands indicating the set of read operations that are in accordance with characteristics (e.g., a predefined target access line, a predefined target valley, a predefined rate of read operations, a predefined quantity of read operations) to generate the identified performance information. For example, in cases that at 305 the memory system identifies performance information associated with a read disturb mechanism, at 315 the memory system may perform the set of read operations that target a predefined access line and occur at a predefined rate (e.g., 100 read operations per millisecond).

At 320, the memory system may generate the performance information associated with the one or more mechanisms based on performing the set of read operations at 315. For example, in cases that at 310 the memory system performs the set of read operations that target the predefined access line and occur at the predefined rate (e.g., based on identifying performance information associated with the read disturb mechanism at 305), the memory system may generate performance information including an average read voltage as a function of the quantity of read operations at 320.

In some cases, after generating the performance information at 320, the memory system may additionally perform a classification operation on the performance information. For example, the memory system may generate additional information associated with the performance information (or associated with portions of the performance information) indicating the one or more mechanisms associated with performance information.

At 325, the memory system may store the performance information (e.g., and associated additional information generated at 320) at the memory system. For example, the memory system may store the performance information at a modeling component of the memory system, at a controller of the memory system, at a buffer or cache of the memory system, at a memory device of the memory system, or a combination thereof. The memory system may store one set of performance information or multiple sets of performance information based on a type of modeling implemented by the memory system. For example, in cases where the memory system implements a stochastic gradient descent algorithm (or another algorithm that relies on a single set of performance information) to correlate the performance information with the read window, then the model may store a single set of performance information. Alternatively, in cases where the memory system implements a gradient descent algorithm to correlate the performance information with the read window, then the memory system may store multiple sets of performance information (e.g., including previously-generated sets of performance information associated with the mechanism).

At 330, the memory system may update one or more coefficients of the model that correlates the performance information with the read window. For example, the memory system may implement an algorithm (e.g., a gradient descent algorithm, a stochastic gradient descent algorithm) to update the one or more coefficients of the model that correlate the performance information with the read window. That is, over time, a correlation between various mechanisms and the read window may change. Thus, at 330 the memory system may implement an algorithm that updates the coefficients correlating the performance information with the read window (e.g., to improve the correlation between the performance information and the read window implemented by the model). By updating the coefficients correlating the information associated with a mechanism to the read window, the system may adapt the model as the correlations between the mechanism and the read window change. In some cases, the memory system may use a linear regression model, a logarithmic regression model, or a combination thereof to correlate the performance information with the read window. In these cases, at 330 the memory system may update one or more coefficients associated with the linear regression model, the logarithmic regression model, or both.

At 335, the memory system may optionally delete the stored performance information. For example, in cases that the memory system does not rely on previously-stored or previously-generated performance information to update the coefficients of the model at 330, the memory system may delete the stored performance information (e.g., in response to using the performance information to update the coefficients of the model). By deleting the performance information, the memory system may reduce overhead associated with modeling or predicting the read window over time. Additionally, or alternatively, in cases that the memory system does rely on previously-stored or previously-generated performance information to update the coefficients of the model at 330, the memory system may refrain from deleting the stored performance information at 335. In such cases, the memory system may use previously stored performance information for a next iteration of updating the coefficients of the model.

At 340, the memory system may optionally transmit signaling indicating the updated coefficients to a host system. For example, the host system may rely on the updated coefficients to correlate performance information with a read window at the memory system. In such cases, based on the correlation between the performance information and the read window indicated by the updated coefficients, the host system may adjust one or more trim parameters associated with read operations at the memory system (e.g., to reduce a change of the read window for memory cells at the memory system). In some cases, the host system may adjust the frequency of data integrity or media scans based on the predicted read window. For example, in cases that a rate of degradation of the read window is relatively high (e.g., in cases that the read window is shifting or decreasing in size relatively quickly), the host system may increase a frequency of data integrity or media scans executed at the memory system. Additionally, in cases that a rate of degradation of the read window is relatively low (e.g., in cases that the read window is shifting or decreasing in size relatively slowly), the host system may decrease a frequency of data integrity or media scans executed at the memory system. Additionally, or alternatively, the host system may be unaware of a correlation between performance information and the read window at the memory system. In such cases, the memory system may refrain from transmitting indications of the coefficients or indications of the updated coefficients to the host system at 340.

At 345, the memory system may perform another set of read operations at the memory device. In some cases, the memory system may adjust one or more parameters associated with performing read operations based on a read window indicated by the updated coefficients correlating the performance information with the read window. That is, the memory system may update a read window, read voltages, timing parameters, or a combination thereof to perform the set of read operations at 345.

In some implementations of the present disclosure, the steps of process flow 300 may be partially or fully implemented by a host system. In some cases, the host system may implement the modeling component at the host system and may implement the steps of process flow 300. Alternatively, the host system may transmit one or more commands to the modeling component in the memory system to generate the performance information associated with a specific mechanism. Further the host system may use the updated coefficients from the memory system for executing the read operations based on the modeling. In this way, the steps of process flow 300 may be fully or partially implemented at the host system.

FIG. 4A illustrates an example of mechanism information 400 that supports a model for predicting memory system performance in accordance with examples as disclosed herein. The mechanism information 400 may illustrate example relationships between various mechanisms 405 and performance information, which may include the x-axis information 415 and y-axis information 430. The mechanism information 400 may additionally include other information related to the mechanisms 405, such as indications of read operation characteristics to generate the x-axis information 415 and y-axis information 430. For example, the mechanism information 400 may include read information 465, target access lines 440, and target valleys 450. In some cases, the mechanism information 400 may be predefined in a memory system. For example, the memory system may receive signaling (e.g., from a host system) indicating the mechanism information 400. Additionally, or alternatively, during an initialization of the memory system, the mechanism information 400 may be predefined or preconfigured.

FIG. 4B illustrates an example of a threshold voltage distribution 401 that supports a model for predicting memory system performance in accordance with examples as disclosed herein. The threshold voltage distribution 401 may be an example of a voltage distribution corresponding to a TLC where a first threshold voltage distribution 470 may be the voltage distribution corresponding to the logical state 111. Additionally, multiple threshold voltage distributions 470 may be present and represent similar logical states (e.g., 011, 001, 101, 100, 000, 010, 110). A read window 475 may correspond to a range of read voltages between two consecutive threshold voltage distributions (e.g., between 111 and 011), where the data may be read reliably. That is, a read window 475 may be a range of read levels between two consecutive voltage threshold distributions 470, where the bit errors may be correctable by an error correction code engine. In some cases, the read window may additionally be associated with voltages at which a read voltage may be applied and current measured to read the logical state of the memory cell. Additionally, or alternatively, the read window may be associated with a range of voltages over which a reference voltage may be placed to distinguish between two states stored on a memory cell. A read voltage range 480 (e.g., mDiffEC) may correspond to a threshold voltage range that approximates the read window 475. For example, if a read voltage is placed above the read voltage range 480, the data read from the memory cell may not be recoverable. Likewise, a read voltage under the read voltage range 480 may correspond to an accurate read. An average read voltage 485 (e.g., centerEC) may correspond to the voltage that differentiates first threshold voltage distribution 470 with a second threshold voltage distribution (e.g., 111 and 011). That is, a read voltage applied to the left of the average read voltage 485 may correspond with a logical state of 111 being read from the memory cell, while a read voltage applied to the right of the average read voltage 485 may correspond to a logical state of 011 being read from the memory cell.

Over time, the read window 475 may change (e.g., become narrower, shift along the x-axis) and the corresponding range of read voltages may be different. Thus, a memory system may rely on the mechanism information 400 to model (e.g., estimate, predict) the change of the read window 475 over time based on one or more of the mechanisms 405.

The mechanism information 400 may include a predefined relationship between the x-axis information 415 and the y-axis information 430 for each mechanism 405. For example, the mechanism information 400 may indicate an x-axis type 410 (e.g., as either a linear axis or a logarithmic axis) and a y-axis type 425 (e.g., as either a linear axis or a logarithmic axis). Additionally, or alternatively, the mechanism information 400 may indicate a degree 460 associated with the function of x-axis information 415 and the y-axis information 430.

For example, in a case where the mechanism 405-a is data retention, the x-axis information 415 associated with the data retention mechanism 405-a may include information 420-a indicating a threshold voltage distribution of one or more memory cells storing a predetermined logic state over time (e.g., associated with the threshold voltage distribution 470 associated with the memory cell storing a logic value '111'), and the y-axis information 430 associated with the data retention mechanism 405-a may include read voltage range information 435-a. Here, the mechanism information 400 may indicate that x-axis type 410-a is logarithmic and the y-axis type 425-a is linear and the degree 460-a associated with the function of the information 420-a and the information 435-a is linear (e.g., associated with a degree of one).

In another case where the mechanism 405-b is a voltage threshold shift mechanism 405-b, the x-axis information 415 associated with the voltage threshold shift mechanism 405-b may include information 420-b indicating time and the y-axis information 430 associated with the voltage threshold shift mechanism 405-b may include information 435-b indicating a threshold voltage distribution of a memory cell storing a predetermined logic state information (e.g., associated with the threshold voltage distribution 470 associated with the memory cell storing the logic value '111'). Here, the mechanism information 400 may indicate that x-axis type 410-b is logarithmic and the y-axis type 425-b is linear and the degree 460-b associated with the function of the information 420-b and the information 435-b is linear (e.g., associated with a degree of one).

In another case where the mechanism 405-c is a read disturb mechanism 405-c, the x-axis information 415 associated with the read disturb mechanism 405-c may include information 420-c indicating a quantity of read operations at one or more memory cells and the y-axis information 430 associated with the read disturb mechanism 405-c may include information 435-c indicating an average read voltage applied to the one or more memory cells during the quantity of read operations. Here, the mechanism information 400 may indicate that x-axis type 410-c is logarithmic and the y-axis type 425-c is logarithmic and the degree 460-c associated with the function of the information 420-c and the information 435-c is quadratic (e.g., associated with a degree of two).

In another case where the mechanism 405-d is a latent read disturb mechanism 405-d, the x-axis information 415 associated with the latent read disturb mechanism 405-d may include information 420-d indicating a threshold voltage distribution of one or more memory cells storing a predetermined logic state over time (e.g., associated with the threshold voltage distribution 470 associated with the memory cell storing a logic value '111'), and the y-axis information 430 associated with the latent read disturb mechanism 405-d may include read voltage range information 435-d. Here, the mechanism information 400 may indicate that x-axis type 410-d is logarithmic and the y-axis type 425-d is linear and the degree 460-d associated with the function of the information 420-d and the information 435-d is linear (e.g., associated with a degree of one).

The mechanism information 400 may additionally include information associated with read operations to generate the information 420 (e.g., including the x-axis information 415) and the information 435 (e.g., including the y-axis information). For example, the mechanism information 400 may indicate, for each mechanism 405, characteristics of read operations used to generate the associated information 420 and 435. The characteristics of read operations indicated by the mechanism information 400 may include the read information 465, which may indicate a quantity of read operations to execute, a rate of executing read operations, or a combination thereof.

Additionally, or alternatively, the mechanism information 400 may indicate a target access line 440, a target valley 450, or both for read operations to generate information 420 and 435 associated with each mechanism 405. In some cases, the target access line 440 indicated by the mechanism information 400 (e.g., a predefined target access line 440) may correspond to an access line 440 that is associated with a worse performance as compared to one or more other access lines at the memory system. In some instances, a list of target access lines 440 may be provided. Here, the average access line of the list of target access lines 440 may be used. In some cases, the target valley 450 indicated by the mechanism information 400 may correspond to a valley (e.g., a read window 475) that is to be modeled. In some cases, all valleys (e.g., each read window 475) of the memory cell may be modeled.

For example, in a case where the mechanism 405-a is data retention, the mechanism information 400 may indicate an access line 445-a at the memory device that is associated with an increased data retention deficit (e.g., as compared to other access lines 445 at the memory device). Additionally, the mechanism information 400 may indicate a valley 455 (e.g., associated with one of the read windows 475) that corresponds to greater data retention changes as compared to other valleys 455. For example, the mechanism information may indicate the valley 455-a associated with the read window 475 between the threshold voltage distributions 470 of a memory cell storing a logic value '110' and a logic value '010' (e.g., the valley V7 corresponding to larger voltages). In some cases, the mechanism information 400 may not indicate a quantity or rate of read operations via the read information 465-a associated with the data retention mechanism 405-a.

In another example where the mechanism 405-b is a voltage threshold shift, the mechanism information 400 may indicate an access line 445-b at the memory device that is associated with an increased voltage threshold shift (e.g., as compared to other access lines 445 at the memory device). Additionally, the mechanism information 400 may indicate a valley 455-b (e.g., associated with one of the read windows 475) that corresponds to greater voltage threshold shifts as compared to other valleys 455. For example, the mechanism information may indicate the valley 455-b associated with the read window 475 between the threshold voltage distribution 470 of a memory cell storing a logic value '110' and a logic value '010' (e.g., the valley V7 corresponding to larger voltages). In some cases, the mechanism information 400 may not indicate a quantity or rate of read operations via the read information 465-b associated with the voltage threshold shift mechanism 405-b.

In another example where the mechanism 405-c is a read disturb mechanism 405-c, the mechanism information 400 may indicate an access line 445-c at the memory device that is associated with an increased read disturb (e.g., as compared to other access lines 445 at the memory device). Additionally, the mechanism information 400 may indicate a valley 455-c (e.g., associated with one of the read windows 475) that corresponds to greater read disturb changes as compared to other valleys 455. For example, the mechanism information may indicate the valley 455-c associated with the read window 475 between the threshold voltage distribution 470 of a memory cell storing a logic value '111' and a logic value '011' (e.g., the valley V1 corresponding to smaller voltages). In some cases, the mechanism information 400 may indicate, via the read information 465-c, a quantity and rate of read operations to generate the information 420-c and 435-c associated with the mechanism 405-c (e.g., 100 read operations per millisecond).

In another example where the mechanism 405-d is a latent read disturb mechanism 405-d, the mechanism information 400 may indicate an access line 445-d at the memory device that is associated with an increased latent read disturb (e.g., as compared to other access lines 445 at the memory device). Additionally, the mechanism information 400 may indicate a valley 455-d (e.g., associated with one of the read windows 475) that corresponds to greater latent read disturbances as compared to other valleys 455. For example, the mechanism information may indicate the valley 455-d associated with the read window 475 between the threshold voltage distribution 470 of a memory cell storing a logic value '111' and a logic value '011' (e.g., the valley V1 corresponding to smaller voltages). In some cases, the mechanism information 400 may indicate, via the read information 465-d, a quantity and rate of read operations to generate the information 420-d and 435-d associated with the mechanism 405-d (e.g., 0.001 read operations per millisecond).

In another example where the mechanism 405-a is a measured read window mechanism 405-a, the mechanism information 400 may indicate read information 465-a indicating a set of read operations associated with a jump search operation or a sweeping operation (e.g., to measure a read window budget such as a read voltage range 480). Here, the memory system may detect read voltages between two adjacent threshold voltage distributions 470 where a quantity of errors in data read from a set of memory cells is equal to a threshold quantity of errors detectable or correctable by the memory system.

To generate the information 420 and 435 associated with a mechanism 405, the memory system may execute read operations that correspond to the target access line 440 associated with the mechanism 405 (e.g., indicated by the mechanism information 400), the target valley 450 associated with the mechanism 405 (e.g., indicated by the mechanism information 400), and in accordance with the read information 465 associated with the mechanism 405.

Figure 5:
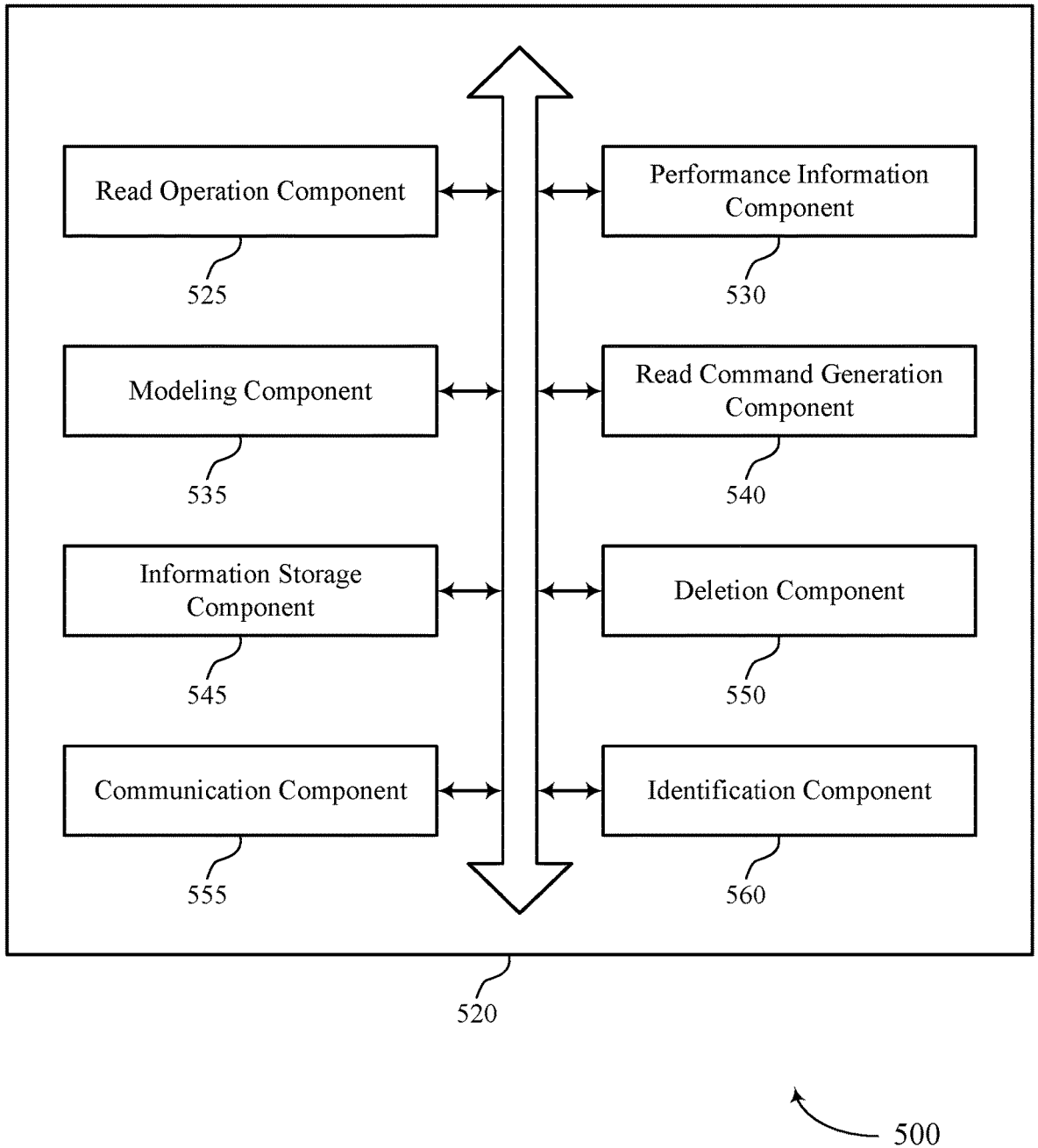
FIG. 5 shows a block diagram of a memory system that supports a model for predicting memory system performance in accordance with examples as disclosed herein.

FIG. 5 shows a block diagram 500 of a memory system 520 that supports a model for predicting memory system performance in accordance with examples as disclosed herein. The memory system 520 may be an example of aspects of a memory system as described with reference to FIGS. 1 through 4. The memory system 520, or various components thereof, may be an example of means for performing various aspects of a model for predicting memory system performance as described herein. For example, the memory system 520 may include a read operation component 525, a performance information component 530, a modeling component 535, a read command generation component 540, an information storage component 545, a deletion component 550, a communication component 555, an identification component 560, or any combination thereof. Each of these components may communicate, directly or indirectly, with one another (e.g., via one or more buses).

The read operation component 525 may be configured as or otherwise support a means for performing a first set of read operations at a memory device of a memory system. The performance information component 530 may be configured as or otherwise support a means for generating information indicating a performance of the memory device associated with performing the first set of read operations. The modeling component 535 may be configured as or otherwise support a means for updating one or more coefficients of a model that correlates the information with a read window associated with read operations of the memory device. In some examples, the read operation component 525 may be configured as or otherwise support a means for performing a second set of read operations at the memory device using one or more updated parameters based on the one or more updated coefficients.

In some examples, the read command generation component 540 may be configured as or otherwise support a means for generating, by the memory device, a first set of read commands indicating the first set of read operations for generating the information indicating the performance of the memory device, where performing the first set of read operations is based on generating the first set of read commands.

In some examples, the identification component 560 may be configured as or otherwise support a means for identifying a quantity of the first set of read operations, a rate of the first set of read operations associated with generating the information, or both, where generating the first set of read commands includes. In some examples, the read command generation component 540 may be configured as or otherwise support a means for generating the first set of read commands indicating the identified quantity of the first set of read operations, the identified rate of the first set of read operations, or both.

In some examples, the identification component 560 may be configured as or otherwise support a means for identifying, from a plurality of access lines at the memory device, one or more access lines that are associated with generating the information, where generating the first set of read commands includes. In some examples, the read command generation component 540 may be configured as or otherwise support a means for generating the first set of read commands indicating the first set of read operations at memory cells coupled with the one or more identified access lines.

In some examples, the information storage component 545 may be configured as or otherwise support a means for storing the information at the memory system based on the generating, where updating the one or more coefficients of the model is based on storing the information. In some examples, the deletion component 550 may be configured as or otherwise support a means for deleting the information from the memory system based on updating the one or more coefficients.

In some examples, the communication component 555 may be configured as or otherwise support a means for transmitting, to a host system, signaling indicating coefficients of the model based on updating the one or more coefficients, where performing the second set of read operations is based on transmitting the signaling to the host system.

In some examples, the communication component 555 may be configured as or otherwise support a means for receiving, from a host system, a first set of read commands indicating the first set of read operations, where performing the first set of read operations is based on receiving the first set of read commands.

In some examples, the information includes a read voltage range associated with performing the first set of read operations, an average read voltage associated with performing the first set of read operations, a threshold voltage distribution of memory cells read by the first set of read operations, a quantity of the first set of read operations, a time duration associated with executing the first set of read operations, a measured read window associated with performing the first set of read operations, or a combination thereof.

In some examples, the one or more updated parameters include an updated threshold voltage for the second set of read operations, updated read voltages applied to memory cells at the memory device during the second set of read operations, an updated timing for performing the second set of read operations, or a combination thereof.

In some examples, the model correlates the information with the read window according to a relationship including a logarithmic relationship, a linear relationship, or a combination thereof.

In some examples, the model includes a linear regression model, a logarithmic regression model, or a combination thereof.

In some examples, updating the model includes implementing a gradient descent algorithm, implementing a stochastic gradient descent algorithm, or a combination thereof.

Figure 6:
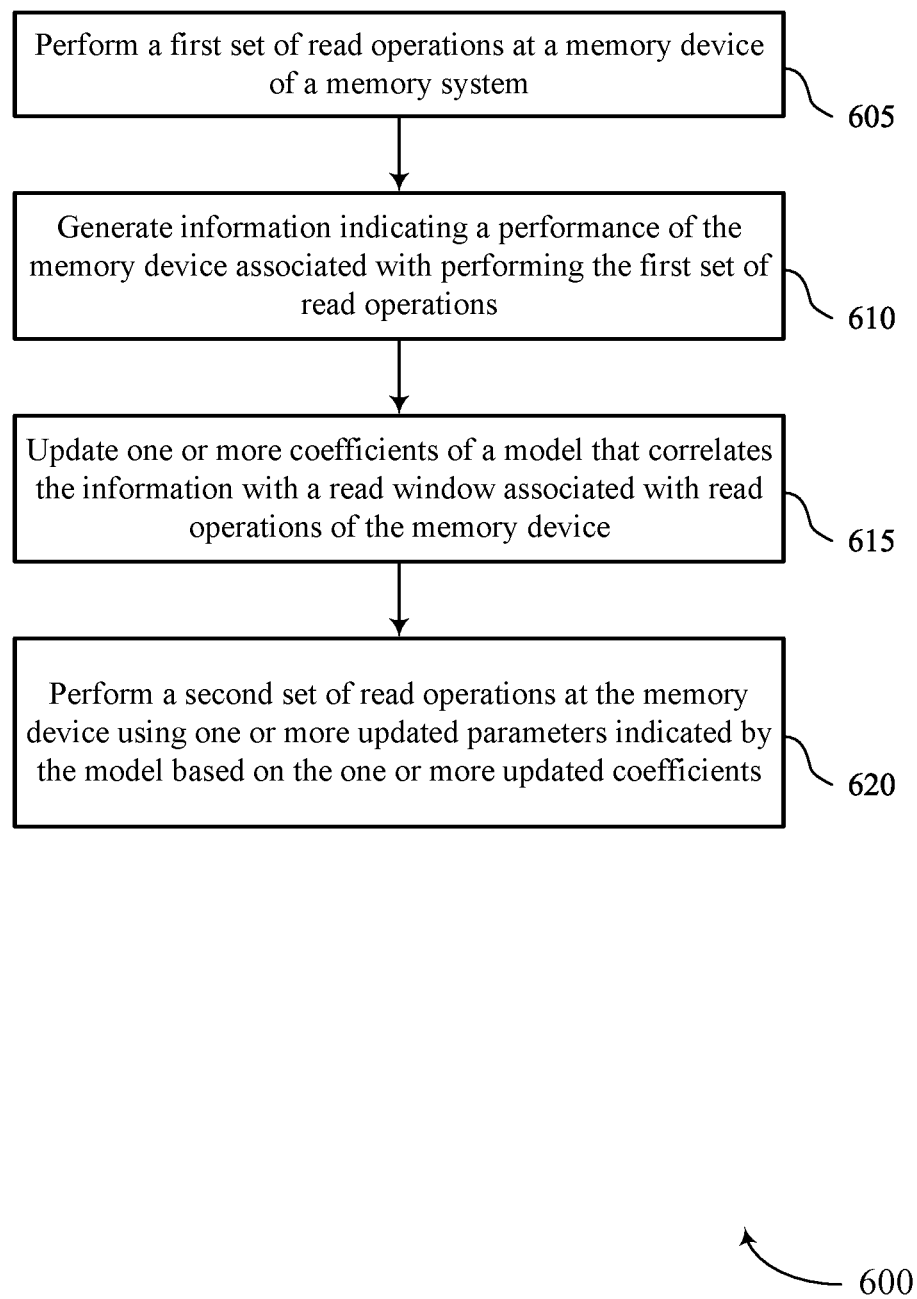
FIG. 6 shows a flowchart illustrating a method or methods that support a model for predicting memory system performance in accordance with examples as disclosed herein.

FIG. 6 shows a flowchart illustrating a method 600 that supports a model for predicting memory system performance in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include performing a first set of read operations at a memory device of a memory system. The operations of 605 may be performed in accordance with examples as disclosed herein. For example, a memory system controller 215 or a read operation component 525 may perform the first set of read operations at the memory device of the memory system.

At 610, the method may include generating information indicating a performance of the memory device associated with performing the first set of read operations. The operations of 610 may be performed in accordance with examples as disclosed herein. For example, the modeling component 285 or a performance information component 530 may generate information indicating a performance of the memory device associated with performing the first set of read operations.

At 615, the method may include updating one or more coefficients of a model that correlates the information with a read window associated with read operations of the memory device. The operations of 615 may be performed in accordance with examples as disclosed herein. For example, the modeling component 285 or a modeling component 535 may update one or more coefficients of the model that correlates the information with a read window associated with read operations of the memory device.

At 620, the method may include performing a second set of read operations at the memory device using one or more updated parameters based on the one or more updated coefficients. The operations of 620 may be performed in accordance with examples as disclosed herein. For example, the memory system controller 215 or the read operation component 525 may perform the second set of read operations at the memory device using one or more updated parameters based on one or more updated coefficients.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing a first set of read operations at a memory device of a memory system; generating information indicating a performance of the memory device associated with performing the first set of read operations; updating one or more coefficients of a model that correlates the information with a read window associated with read operations of the memory device; and performing a second set of read operations at the memory device using one or more updated parameters based on the one or more updated coefficients.

Aspect 2: The method, apparatus, or non-transitory computer-readable medium of aspect 1, further including operations, features, circuitry, logic, means, or instructions, or any combination thereof for generating, by the memory device, a first set of read commands indicating the first set of read operations for generating the information indicating the performance of the memory device, where performing the first set of read operations is based on generating the first set of read commands.

Aspect 3: The method, apparatus, or non-transitory computer-readable medium of aspect 2, further including operations, features, circuitry, logic, means, or instructions, or any combination thereof for identifying a quantity of the first set of read operations, a rate of the first set of read operations associated with generating the information, or both, where generating the first set of read commands includes and generating the first set of read commands indicating the identified quantity of the first set of read operations, the identified rate of the first set of read operations, or both.

Aspect 4: The method, apparatus, or non-transitory computer-readable medium of any of aspects 2 through 3, further including operations, features, circuitry, logic, means, or instructions, or any combination thereof for identifying, from a plurality of access lines at the memory device, one or more access lines that are associated with generating the information, where generating the first set of read commands includes and generating the first set of read commands indicating the first set of read operations at memory cells coupled with the one or more identified access lines.

Aspect 5: The method, apparatus, or non-transitory computer-readable medium of any of aspects 1 through 4, further including operations, features, circuitry, logic, means, or instructions, or any combination thereof for storing the information at the memory system based on the generating, where updating the one or more coefficients of the model is based on storing the information and deleting the information from the memory system based on updating the one or more coefficients.

Aspect 6: The method, apparatus, or non-transitory computer-readable medium of any of aspects 1 through 5, further including operations, features, circuitry, logic, means, or instructions, or any combination thereof for transmitting, to a host system, signaling indicating coefficients of the model based on updating the one or more coefficients, where performing the second set of read operations is based on transmitting the signaling to the host system.

Aspect 7: The method, apparatus, or non-transitory computer-readable medium of any of aspects 1 through 6, further including operations, features, circuitry, logic, means, or instructions, or any combination thereof for receiving, from a host system, a first set of read commands indicating the first set of read operations, where performing the first set of read operations is based on receiving the first set of read commands.

Aspect 8: The method, apparatus, or non-transitory computer-readable medium of any of aspects 1 through 7, where the information includes a read voltage range associated with performing the first set of read operations, an average read voltage associated with performing the first set of read operations, a threshold voltage distribution of memory cells read by the first set of read operations, a quantity of the first set of read operations, a time duration associated with executing the first set of read operations, a measured read window associated with performing the first set of read operations, or a combination thereof.

Aspect 9: The method, apparatus, or non-transitory computer-readable medium of any of aspects 1 through 8, where the one or more updated parameters include an updated threshold voltage for the second set of read operations, updated read voltages applied to memory cells at the memory device during the second set of read operations, an updated timing for performing the second set of read operations, or a combination thereof.

Aspect 10: The method, apparatus, or non-transitory computer-readable medium of any of aspects 1 through 9, where the model correlates the information with the read window according to a relationship including a logarithmic relationship, a linear relationship, or a combination thereof.

Aspect 11: The method, apparatus, or non-transitory computer-readable medium of any of aspects 1 through 10, where the model includes a linear regression model, a logarithmic regression model, or a combination thereof.

Aspect 12: The method, apparatus, or non-transitory computer-readable medium of any of aspects 1 through 11, where updating the model includes implementing a gradient descent algorithm, implementing a stochastic gradient descent algorithm, or a combination thereof.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    performing a first set of read operations at a memory device of a memory system;
    generating information indicating a performance of the memory device associated with performing the first set of read operations;
    updating one or more coefficients of a model that correlates the information indicating the performance of the memory device with a read window associated with read operations of the memory device, wherein the model comprises a linear regression model, a logarithmic regression model, or a combination thereof; and
    performing a second set of read operations at the memory device using one or more updated parameters based on the one or more updated coefficients.

2. The method of claim 1, further comprising:
    generating, by the memory device, a first set of read commands indicating the first set of read operations for generating the information indicating the performance of the memory device, wherein performing the first set of read operations is based on generating the first set of read commands.

3. The method of claim 2, further comprising:
    identifying a quantity of the first set of read operations, a rate of the first set of read operations associated with generating the information, or both, wherein generating the first set of read commands comprises:
    generating the first set of read commands indicating the identified quantity of the first set of read operations, the identified rate of the first set of read operations, or both.

4. The method of claim 2, further comprising:
    identifying, from a plurality of access lines at the memory device, one or more access lines that are associated with generating the information, wherein generating the first set of read commands comprises:
    generating the first set of read commands indicating the first set of read operations at memory cells coupled with the one or more identified access lines.

5. The method of claim 1, further comprising:
    storing the information at the memory system based on the generating, wherein updating the one or more coefficients of the model is based on storing the information; and
    deleting the information from the memory system based on updating the one or more coefficients.

6. The method of claim 1, further comprising:
    transmitting, to a host system, signaling indicating coefficients of the model based on updating the one or more coefficients, wherein performing the second set of read operations is based on transmitting the signaling to the host system.

7. The method of claim 1, further comprising:
    receiving, from a host system, a first set of read commands indicating the first set of read operations, wherein performing the first set of read operations is based on receiving the first set of read commands.

8. The method of claim 1, wherein the information comprises a read voltage range associated with performing the first set of read operations, an average read voltage associated with performing the first set of read operations, a threshold voltage distribution of memory cells read by the first set of read operations, a quantity of the first set of read operations, a time duration associated with executing the first set of read operations, a measured read window associated with performing the first set of read operations, or a combination thereof.

9. The method of claim 1, wherein the one or more updated parameters comprise an updated threshold voltage for the second set of read operations, updated read voltages applied to memory cells at the memory device during the second set of read operations, an updated timing for performing the second set of read operations, or a combination thereof.

10. The method of claim 1, wherein updating the model comprises implementing a gradient descent algorithm, implementing a stochastic gradient descent algorithm, or a combination thereof.

11. A method, comprising:
    performing a first set of read operations at a memory device of a memory system;
    generating information indicating a performance of the memory device associated with performing the first set of read operations;
    updating one or more coefficients of a model that correlates the information with a read window associated with read operations of the memory device, wherein the model correlates the information with the read window according to a relationship comprising a logarithmic relationship, a linear relationship, or a combination thereof, and
    performing a second set of read operations at the memory device using one or more updated parameters based on the one or more updated coefficients.

12. An apparatus, comprising:
a memory device; and
a controller coupled with the memory device and configured to cause the apparatus to:
perform a first set of read operations at the memory device;
generate information indicating a performance of the memory device associated with performing the first set of read operations;
update one or more coefficients of a model that correlates the information indicating the performance of the memory device with a read window associated with read operations of the memory device, wherein the model comprises a linear regression model, a logarithmic regression model, or a combination thereof; and
perform a second set of read operations at the memory device using one or more updated parameters based on the one or more updated coefficients.

13. The apparatus of claim 12, wherein the controller is further configured to cause the apparatus to:
generate, by the memory device, a first set of read commands indicating the first set of read operations for generating the information indicating the performance of the memory device, wherein performing the first set of read operations is based on generating the first set of read commands.

14. The apparatus of claim 13, wherein the controller is further configured to cause the apparatus to:
identify a quantity of the first set of read operations, a rate of the first set of read operations associated with generating the information, or both, wherein generating the first set of read commands comprises:
generate the first set of read commands indicating the identified quantity of the first set of read operations, the identified rate of the first set of read operations, or both.

15. The apparatus of claim 13, wherein the controller is further configured to cause the apparatus to:
identify, from a plurality of access lines at the memory device, one or more access lines that are associated with generating the information, wherein generating the first set of read commands comprises:
generate the first set of read commands indicating the first set of read operations at memory cells coupled with the one or more identified access lines.

16. The apparatus of claim 12, wherein the controller is further configured to cause the apparatus to:
store the information at the apparatus based on the generating, wherein updating the one or more coefficients of the model is based on storing the information; and
delete the information from the apparatus based on updating the one or more coefficients.

17. The apparatus of claim 12, wherein the controller is further configured to cause the apparatus to:
transmit, to a host system, signaling indicating coefficients of the model based on updating the one or more coefficients, wherein performing the second set of read operations is based on transmitting the signaling to the host system.

18. The apparatus of claim 12, wherein the controller is further configured to cause the apparatus to:
receive, from a host system, a first set of read commands indicating the first set of read operations, wherein performing the first set of read operations is based on receiving the first set of read commands.

19. The apparatus of claim 12, wherein the information comprises a read voltage range associated with performing the first set of read operations, an average read voltage associated with performing the first set of read operations, a threshold voltage distribution of memory cells read by the first set of read operations, a quantity of the first set of read operations, a time duration associated with executing the first set of read operations, a measured read window associated with performing the first set of read operations, or a combination thereof.

20. The apparatus of claim 12, wherein the one or more updated parameters comprise an updated threshold voltage for the second set of read operations, updated read voltages applied to memory cells at the memory device during the second set of read operations, an updated timing for performing the second set of read operations, or a combination thereof.

21. The apparatus of claim 12, wherein the model correlates the information with the read window according to a relationship comprising a logarithmic relationship, a linear relationship, or a combination thereof.

22. The apparatus of claim 12, wherein updating the model comprises implementing a gradient descent algorithm, implementing a stochastic gradient descent algorithm, or a combination thereof.

23. A non-transitory computer-readable medium storing code, the code comprising instructions executable by a processor to:
perform a first set of read operations at a memory device of a memory system;
generate information indicating a performance of the memory device associated with performing the first set of read operations;
update one or more coefficients of a model that correlates the information indicating the performance of the memory device with a read window associated with read operations of the memory device, wherein the model comprises a linear regression model, a logarithmic regression model, or a combination thereof; and
perform a second set of read operations at the memory device using one or more updated parameters based on the one or more updated coefficients.

* * * * *